(12) United States Patent
Furubayashi et al.

(10) Patent No.: US 10,768,020 B2
(45) Date of Patent: Sep. 8, 2020

(54) CAPACITIVE SENSOR

(71) Applicant: Hitachi, Ltd., Chiyoda-ku, Tokyo (JP)

(72) Inventors: Yuki Furubayashi, Tokyo (JP);
Takashi Oshima, Tokyo (JP); Makoto Takahashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 270 days.

(21) Appl. No.: 15/760,723

(22) PCT Filed: Aug. 31, 2016

(86) PCT No.: PCT/JP2016/075388
§ 371 (c)(1),
(2) Date: Mar. 16, 2018

(87) PCT Pub. No.: WO2018/042528
PCT Pub. Date: Mar. 8, 2018

(65) Prior Publication Data
US 2018/0259364 A1 Sep. 13, 2018

(51) Int. Cl.
*G01D 5/241* (2006.01)
*G01P 15/125* (2006.01)
(Continued)

(52) U.S. Cl.
CPC .............. *G01D 5/241* (2013.01); *G01D 5/24* (2013.01); *G01D 5/2417* (2013.01);
(Continued)

(58) Field of Classification Search
None
See application file for complete search history.

(56) References Cited

U.S. PATENT DOCUMENTS

2006/0213270 A1* 9/2006 O'Dowd ............... H03M 3/34
73/514.32
2007/0247171 A1 10/2007 O'Dowd et al.
(Continued)

FOREIGN PATENT DOCUMENTS

EP 2 653 846 A1 10/2013
JP 9-72757 A 3/1997
(Continued)

OTHER PUBLICATIONS

International Search Report (PCT/ISA/220 & PCT/ISA/210) issued in PCT Application No. PCT/JP2016/075388 dated Nov. 29, 2016 with English translation (eight (8) pages).
(Continued)

*Primary Examiner* — Jas A Sanghera
(74) *Attorney, Agent, or Firm* — Crowell & Moring LLP

(57) ABSTRACT

The present invention is directed to a CV conversion amplifier which is small in current consumption and capable of securing a sufficient capacitance-voltage conversion gain and a sufficient amplitude range of an output voltage and a capacitive sensor using the same which is low power consumption, low in noise, and wide in an input signal allowable range. A capacitive sensor includes first and second detection capacitors, a CV conversion circuit includes first and second feedback capacitors and obtains a voltage based on capacitance values of the first and second feedback capacitors, an AD converter performs analog digital conversion on an input voltage and obtains a digital signal, a digital control unit receives the digital signal as an input, and first and second digitally controlled variable capacitors have capacitance values that are controlled by the digital control unit.

14 Claims, 9 Drawing Sheets

(51) Int. Cl.
*G01D 5/24* (2006.01)
*G01P 15/08* (2006.01)
*H03K 17/955* (2006.01)

(52) U.S. Cl.
CPC ........ *G01P 15/0802* (2013.01); *G01P 15/125* (2013.01); *H03K 17/955* (2013.01)

(56) References Cited

U.S. PATENT DOCUMENTS

| | | |
|---|---|---|
| 2013/0055564 A1 | 3/2013 | Balachandran et al. |
| 2013/0057301 A1 | 3/2013 | Balachandran et al. |

FOREIGN PATENT DOCUMENTS

| | | |
|---|---|---|
| JP | 2007-3300 A | 1/2007 |
| JP | 2014-529972 A | 11/2014 |
| JP | 2015-135245 A | 7/2015 |

OTHER PUBLICATIONS

Japanese-language Written Opinion (PCT/ISA/237) issued in PCT Application No. PCT/JP2016/075388 dated Nov. 29, 2016 (three (3) pages).

\* cited by examiner

CAPACITIVE SENSOR

TECHNICAL FIELD

The present invention relates to an A/D converter and a capacitive sensor using the same.

BACKGROUND ART

In MEMS capacitive acceleration sensors, angular velocity sensors, angle sensors, and the like, a CV conversion amplifier that converts a change $\Delta C$ in a capacitance value generated in an MEMS capacitive element into a voltage signal $\Delta V$ is used. It is necessary for the CV conversion amplifier to make a capacitance-voltage conversion gain $\Delta V/\Delta C$ as large as possible in to relieve a noise specification of a circuit block at a subsequent stage.

However, in the past, if the capacitance-voltage conversion gain is increased, there is a problem in that an amplitude range of an output voltage of the CV conversion amplifier is remarkably decreased. The reason is that in the case of a pseudo differential CV conversion amplifier in which two single-ended operational amplifiers are used in parallel, if the capacitance-voltage conversion gain is increased, a center voltage level of an output of each single-ended operational amplifier considerably deviates from a desired value (usually, about ½ of a power voltage).

Further, in the case of a fully differential CV conversion amplifier in which one fully differential operational amplifier is used, if the capacitance-voltage conversion gain is increased, a common mode voltage of an input of the fully differential operational amplifier considerably deviates from a desired value. If the amplitude range of the output voltage of the CV conversion amplifier is decreased, an input signal allowable range of a sensor is narrowed. For example, in the case of an acceleration sensor, a range of an input acceleration signal which is normally detectable is narrowed.

In this regard, in the past, the output amplitude range of the CV conversion amplifier is secured such that a signal of a high voltage level among differential output signals of the CV conversion amplifier is determined by an OR circuit, held in a peak hold circuit, and a voltage for adjusting the center voltage level of the output is continuously generated. Further, when a setting of an adjustment voltage is stored as a digital value in advance, it is possible to select a suitable parameter in accordance with characteristics of a capacitive sensor. A configuration to which such a common mode voltage adjustment analog circuit is added is described in, for example, Patent Document 1.

CITATION LIST

Patent Document

Patent Document 1: JP 2007-3300 A

SUMMARY OF THE INVENTION

Problems to be Solved by the Invention

In the configuration to which the common mode voltage adjustment analog circuit described above is added, the capacitance-voltage conversion gain of the CV conversion amplifier and the amplitude range of the output voltage can be secured, but since the voltage for adjusting the center voltage level of the output is continuously generated through an analog circuit, there is a problem in that power consumption is increased. Further, since the signal of the high voltage level among the differential output signals of the CV conversion amplifier is detected by the OR circuit and used for the generation of the adjustment voltage, when there is a large differential signal, the amplitude range of the output voltage is likely to be narrowed without detecting the common mode signal with a high degree of accuracy. Further, in a case in which the setting of the adjustment voltage is stored as the digital value in advance, an A/D converter for converting an analog adjustment voltage to a digital signal is necessary separately from an analog sensor, and a capacitance change or an adjustment voltage of an MEMS of an adjustment target fluctuates due to temperature fluctuation or the like, an adjustment accuracy deteriorates, and thus the amplitude range of the output voltage is likely to be narrowed.

In this regard, an object of the present invention to provide a CV conversion amplifier which is small in an increase in current consumption and capable of adjusting the common mode voltage with a high degree of accuracy and securing the capacitance-voltage conversion gain and the amplitude range of the output voltage and a capacitive sensor using the same which is low in power consumption and wide in an input signal allowable range.

Solutions to Problems

According to one aspect of the present invention to solve the above problem, provided is a capacitive sensor including first and second detection capacitors, a CV conversion circuit that includes first and second feedback capacitors and obtains a voltage based on capacitance values of the first and second feedback capacitors, an AD converter that performs analog digital conversion on an input voltage and obtains a digital signal, a digital control unit that receives the digital signal as an input, and first and second digitally controlled variable capacitors having capacitance values which are controlled by the digital control unit. In the capacitive sensor, in a case in which a physical quantity serving as a measurement target is not substantially zero, capacitance values of the first and second detection capacitors are changed from capacitance values in a case in which the physical quantity is substantially zero in accordance with the physical quantity as the measurement target, and change amounts of the capacitance values of the first and second detection capacitors are opposite in sign to each other and substantially equal in an absolute value to each other. The first and second feedback capacitors accumulate charges in which the capacitance values of the first detection capacitor, the second detection capacitor, the first digitally controlled variable capacitor, and the second digitally controlled variable capacitor are reflected. A common mode voltage level of an input voltage of the CV conversion circuit or a common mode voltage level of an output voltage is controlled in accordance with control of the first and second digitally controlled variable capacitors.

According to another aspect of the present invention, provided is a capacitive sensor including a first MEMS capacitive element having a capacitance value changing in accordance with reflection of a change in a physical quantity, a second MEMS capacitive element having a capacitance value changing in accordance with reflection of a change in a physical quantity, a first variable capacitor connected with the first MEMS capacitive element, a second variable capacitor connected with the second MEMS capacitive element, and a first input terminal, a second input terminal, a first output terminal, and a second output terminal. The sensor includes a CV conversion circuit that generates a voltage in which a change in the capacitance value of the first MEMS capacitive element and a change in the capacitance value of the second MEMS capacitive element are reflected, a detection circuit that detects an average voltage of input voltages of the first input terminal and the second input terminal of the CV conversion circuit or an average voltage of output voltages of the first output terminal and the second output terminal of the CV conversion circuit detection circuit, an analog digital converter that converts the average voltage into a digital average voltage signal, and a control circuit that changes the capacitance values of the first variable capacitor and the second variable capacitor on the basis of the digital average voltage signal, wherein a connection point of the first MEMS capacitive element and the first variable capacitor is connected to the first input terminal, and a connection point of the second MEMS capacitive element and the second variable capacitor is connected to the second input terminal.

According to another aspect of the present invention, provided is a capacitive sensor including a sensor unit that includes a pair of capacitors configured with a fixed electrode and a movable electrode, applies a voltage to one of the fixed electrode and the movable electrode, extracts charges accumulated in the pair of capacitors from the other electrode, and obtains two output signals, a CV converting unit that receives the two output signals as an input, reflects the charges extracted from the sensor unit in a capacitance value of a feedback capacitor, converts a voltage signal, and obtains a differential output, an AD converter that converts the differential output of the CV converting unit into a digital signal, and a variable capacitor having a capacitance value which is controlled on the basis of the digital signal. In the capacitive sensor, one electrode of the variable capacitor is connected to the other electrode from which the accumulated charges are extracted, and a common mode output potential of the differential output is controlled by controlling a capacitance value of the variable capacitor.

Effects of the Invention

According to the present invention, unlike the adjustment by the analog circuit, it is unnecessary to constantly perform an operation, and it is possible to adjust the common mode voltage level with low power consumption.

MODE FOR CARRYING OUT THE INVENTION

Figure 1:
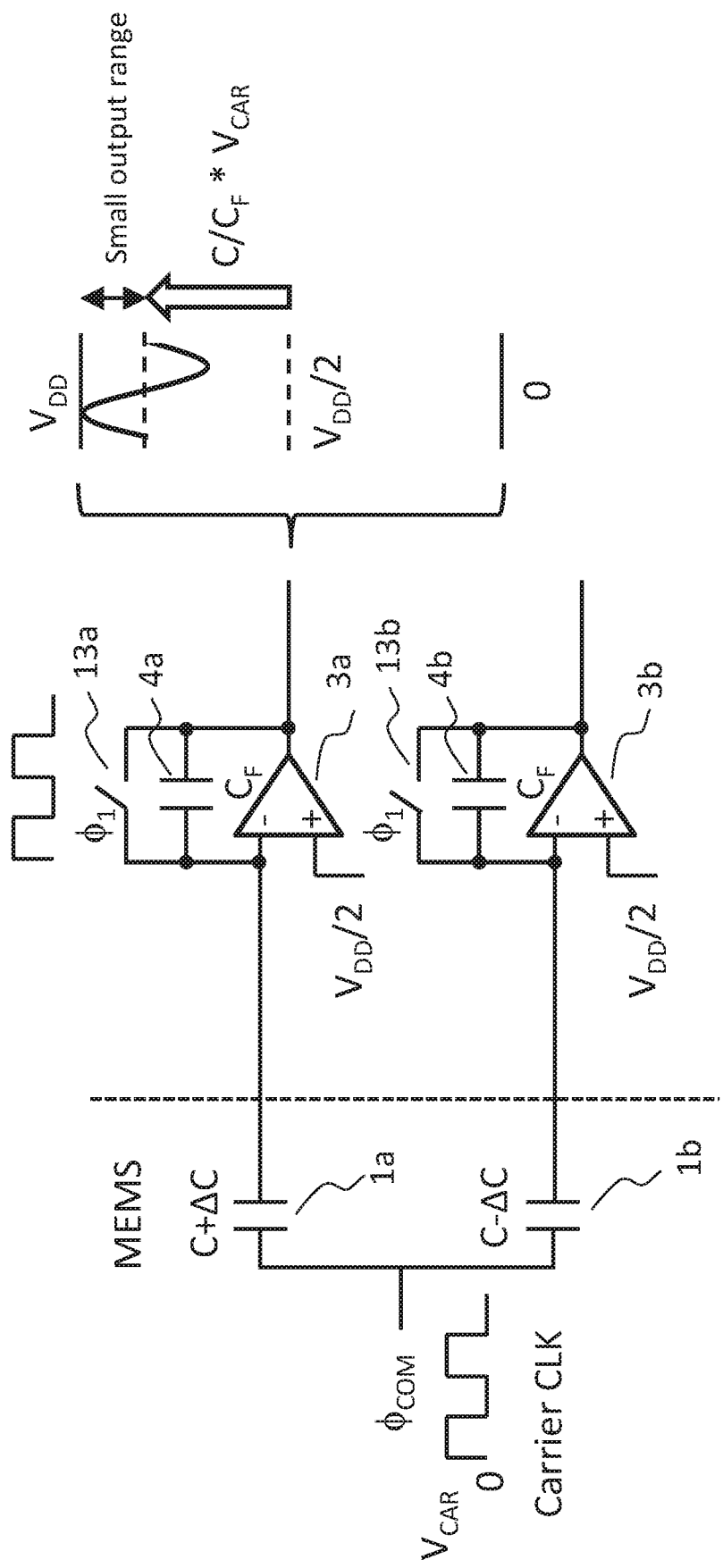
FIG. 1 is an explanatory diagram of a problem to be solved by an embodiment.

Hereinafter, exemplary embodiments will be described in detail with reference to the appended drawings. However, the present invention is not interpreted to be limited to the description of the embodiments set forth below. It would be easily understood by those skilled in the art that a specific configuration of the present invention can be modified within the scope not departing from the spirit of the present invention.

In a configuration of the invention to be described below, parts having the same or similar functions are denoted by the same reference numerals in different drawings, and redundant descriptions may be omitted.

In this specification, notations such as "first," "second," and "third" are attached to identify constituent elements and need not necessarily limit numbers or an order. Further, numbers identifying constituent elements are used for each context, and the numbers used in one context does not necessarily indicate the same configuration in other contexts. A constituent element identified by a certain number is not precluded from doubling as a function of a constituent element identified by another number.

A position, a size, a shape, a range, or the like of each component illustrated in the drawings or the like may not indicate an actual position, an actual size, an actual shape, an actual range, or the like in order to facilitate understanding of the invention. Therefore, the present invention is not necessarily limited to a position, a size, a shape, a range, or the like illustrated on the drawings or the like.

In order to understand a configuration and effects of the present embodiment, first, a problem to be solved by the present embodiment will be described.

FIG. 1 illustrates a configuration of a pseudo differential CV conversion amplifier according to a related art and a problem of a reduction in the amplitude range of the output voltage of the output voltage caused because the center voltage level of the output deviates from a desired value (usually about ½ of the power voltage).

Referring to FIG. 1, since two single-ended operational amplifiers 3a and 3b are constantly in a closed loop state, potentials of nodes connected to inverting input terminals of the operational amplifiers constantly become $V_{DD}/2$ ($V_{DD}$ is a power voltage).

During a period in which a carrier clock (Carrier CLK) $\phi_{COM}$ is a high voltage (a voltage value $V_{CAR}$), and a clock signal $\phi_1$ is a high voltage, operational amplifier side electrodes of a pair of two detection MEMS capacitive elements 1a and 1b are charged with charges of $(C+\Delta C)*(V_{CAR}-V_{DD}/2)$ and charges of $-(C-\Delta C)*(V_{CAR}-V_{DD}/2)$. Capacitance values of the two detection MEMS capacitive elements 1a and 1b are indicated by $C+\Delta C$ and $C-\Delta C$, respectively. C indicates capacitance values of the two detection MEMS capacitive elements when a signal such as acceleration is not applied to the sensor. $\Delta C$ indicates capacitance value changes occurring in the two detection MEMS capacitive elements when a signal such as acceleration is applied to the sensor.

Further, since the clock signal $\phi_1$ is a high voltage, switches 13a and 13b connected in parallel with feedback capacitive elements (a capacitance value $C_F$) 4a and 4b of the operational amplifiers 3a and 3b are in an ON state, both electrodes of the feedback capacitive elements 4a and 4b are short-circuited, and the charges on the electrodes of the feedback capacitive element are discharged to zero.

Then, the carrier clock $\phi_{COM}$ and the clock signal $\phi_1$ transition from the high voltage to a low voltage. Since the carrier clock $\phi_{COM}$ is the low voltage (0 potential), potentials of the carrier clock side electrodes of the two detection MEMS capacitive elements 1a and 1b are zero. Therefore, charges of $(C+\Delta C)*V_{DD}/2$ and charges of $(C-\Delta C)*V_{DD}/2$ are induced to the operational amplifier side electrodes of the two detection MEMS capacitive elements, respectively. As a result, difference charges with $-(C+\Delta C)*(V_{CAR}-V_{DD}/2)$ and $-(C-\Delta C)*(V_{CAR}-V_{DD}/2)$ accumulated on the operational amplifier side electrodes of the two detection MEMS capacitive elements 1a and 1b until then are transferred from the operational amplifier input side electrodes of the feedback capacitive elements 4a and 4b to the detection MEMS capacitive elements 1a and 1b.

Since clock signal $\phi_1$ is the low voltage, the switches 13a and 13b connected in parallel with the feedback capacitive elements 4a and 4b are in an OFF state, and thus the difference charges are supplied only from feedback capacitive elements. Since the charges of the operational amplifier input side electrodes of the feedback capacitive elements 4a and 4b have been zero until then, charges $Q_{FP}$ of the operational amplifier input side electrode of the feedback capacitive element 4a on the upper side of FIG. 1 eventually become $Q_{FP}=0-[(C+\Delta C)*V_{DD}/2-\{-(C+\Delta C)*(V_{CAR}-V_{DD}/2)\}]=-\Delta C*V_{CAR}-C*V_{CAR}$. Further, charges $Q_{FN}$ of the operational amplifier input side electrode of the feedback capacitive element 4b on the lower side of FIG. 1 become $Q_{FN}=0-[(C-\Delta C)*V_{DD}/2-\{-(C-\Delta C)*(V_{CAR}-V_{DD}/2)\}]=\Delta C*V_{CAR}-C*V_{CAR}$.

Therefore, an output $V_{OUTP}$ of the operational amplifier 3a on the upper side of FIG. 1 and an output $V_{OUTN}$ of the operational amplifier 3b on the lower side become as follows since $V_{OUTP}=V_{DD}/2-Q_{FP}/C_F$ and $V_{OUTN}=V_{DD}/2-Q_{FN}/C_F$.

$$V_{OUTP} = \frac{V_{DD}}{2} + V_{CAR} \cdot \frac{C}{C_F} + V_{CAR} \cdot \frac{\Delta C}{C_F} \quad [\text{Math. 1}]$$

$$V_{OUTN} = \frac{V_{DD}}{2} + V_{CAR} \cdot \frac{C}{C_F} - V_{CAR} \cdot \frac{\Delta C}{C_F} \quad [\text{Math. 2}]$$

A differential output $V_{OUT}(=V_{OUTP}-V_{OUTN})$ and an output common mode voltage $V_{CMO}(=(V_{OUTP}+V_{OUTN})/2)$ of the CV conversion amplifier become as follows.

$$V_{OUT} = 2V_{CAR} \cdot \frac{\Delta C}{C_F} \quad [\text{Math. 3}]$$

$$V_{CMO} = \frac{V_{DD}}{2} + V_{CAR} \cdot \frac{C}{C_F} \quad [\text{Math. 4}]$$

Therefore, due to the capacitance values C of the detection MEMS capacitive elements 1a and 1b, the output common mode voltage level $V_{CMO}$ deviates from a desired value $V_{DD}/2$ by $V_{CAR}*C/C_F$. Since the feedback capacitance value $C_F$ is unable to be set to a large value in order to increase the capacitance-voltage conversion gain, the deviation $V_{CAR}*C/C_F$ becomes a large voltage. Accordingly, the amplitude range of the output voltage of the CV conversion amplifier is remarkably decreased.

A representative capacitive sensor of the present invention to be described below includes a common mode detection circuit that performs resistance voltage division on a differential output signal of the CV amplifier, a digital signal processing unit that includes an output terminal which is connected to one input terminal of a differential A/D converter via a switch and a fixed potential connected to the other input terminal via a switch, detects a common mode voltage through an A/D converter, and assigns a deviation from a desired center voltage level as a digital value, and a D/A converter which is controlled in accordance with the digital value, and compensates an output center voltage level and sets it to an appropriate center voltage level.

First Embodiment

Figure 2:
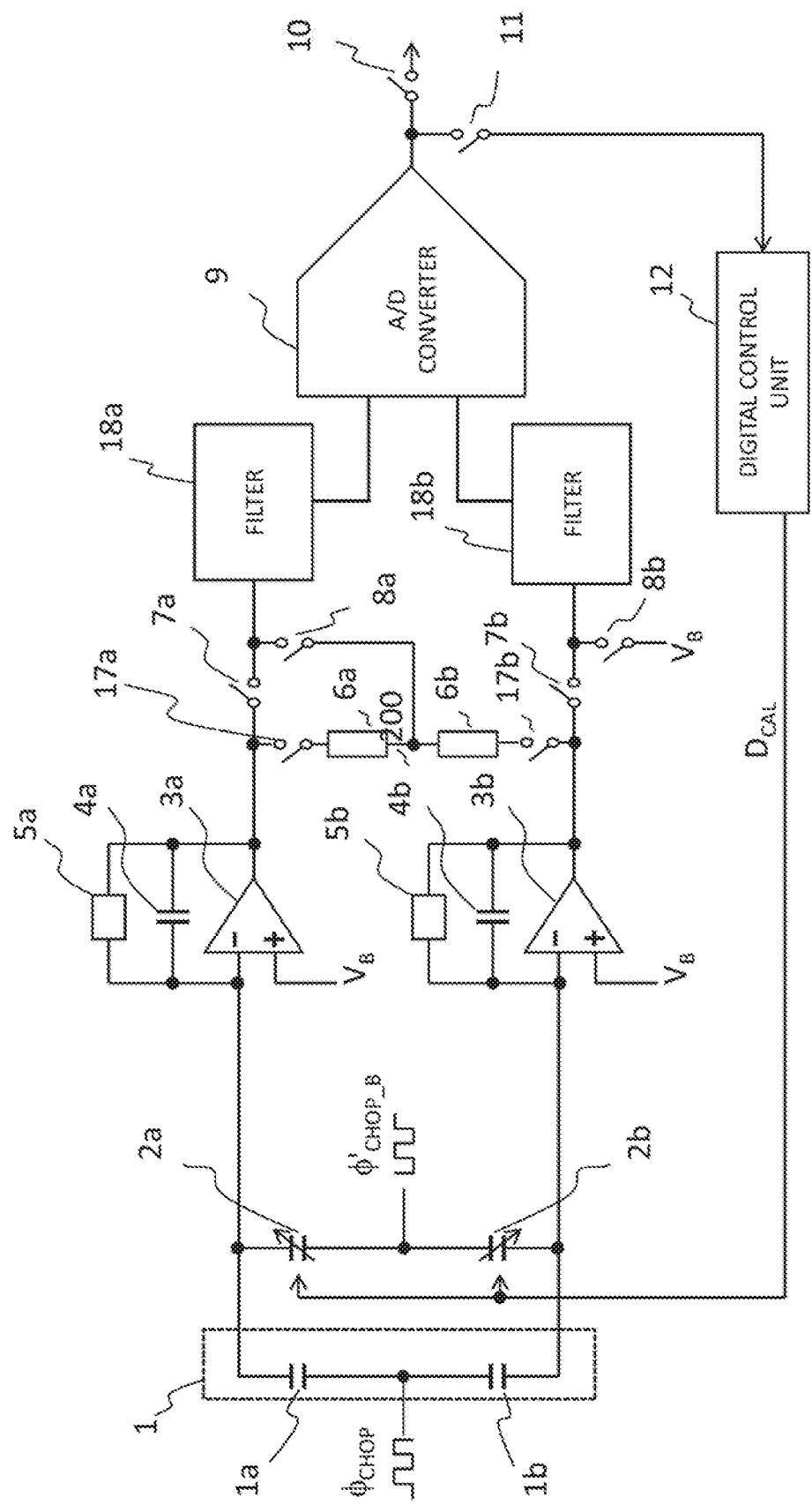
FIG. 2 is a circuit diagram illustrating a first embodiment of the present invention.

FIG. 2 illustrates a first embodiment of the present invention. This is an example of a pseudo differential CV conversion amplifier. In this embodiment, a circuit that detects an output center voltage of the pseudo differential CV conversion amplifier is installed, the output center voltage is converted into a digital signal, and a capacitance value of a digitally controlled variable capacitor is controlled in accordance with the digital signal. First, a configuration will be described.

A capacitive MEMS 1 includes two detection MEMS capacitive elements 1a (a capacitance value C) and 1b (a capacitance value C), and one of electrodes thereof is a movable electrode which can be mechanically moved. The movable electrodes of the detection MEMS capacitive elements 1a and 1b are connected to a carrier clock $\phi_{CHOP}$, and the other electrodes (fixed electrodes) are connected to inverting input terminals of operational amplifiers 3a and 3b, respectively. Further, feedback capacitive elements 4a (a capacitance value $C_F$) and 4b (a capacitance value $C_F$) and resistive elements 5a (a resistance value $R_F$) and 5b (a resistance value $R_F$) are installed between the inverting input terminals and the output terminals of the operational amplifiers 3a and 3b. A switch may be installed between the feedback capacitive elements 4a and 4b and the operational amplifiers 3a and 3b. Further, the non-inverting input terminals of the operational amplifiers 3a and 3b are connected to a voltage $V_B$. In this case, $V_B=V_{DD}/2$.

In the configuration of FIG. 2, unlike the configuration of FIG. 1, the resistive elements 5a and 5b are installed between the inverting input terminals and the output terminals of the operational amplifiers 3a and 3b instead of the switches 13a and 13b. For this reason, a signal for driving the switch is unnecessary. A difference lies in that in the configuration of FIG. 1, the capacitance change is sampled and held as a voltage change, whereas in the configuration of FIG. 2, the capacitance change is continuously detected as a voltage change.

In the present configuration, digitally controlled variable capacitors 2a (a capacitance value $C_{DIG}$) and 2b (a capacitance value $C_{DIG}$) are connected in parallel with the detection MEMS capacitive elements 1a and 1b. $\phi'_{CHOP\_B}$ obtained by inverting the carrier clock $\phi_{CHOP}$ and changing a level appropriately is connected to the digitally controlled variable capacitors 2a and 2b. The digitally controlled variable capacitor may be called a capacitive D/A converter and has the capacitance value which can be controlled in accordance with a digital signal.

Outputs of the operational amplifiers 3a and 3b of the CV conversion amplifier are connected to differential input terminals of an A/D converter 9 via differential voltage detection switches 7a and 7b and filters 18a and 18b. The A/D converter 9 removes a common mode noise and interference using differential inputs.

Common mode voltage detection resistors 6a and 6b are inserted in series between the outputs of the operational amplifiers 3a and 3b via common mode voltage generation switches 17a and 17b, and a joint node 200 of the common mode voltage detection resistors 6a and 6b is connected to a normal phase input terminal of the A/D converter 9 via a common mode voltage detection switch 8a. Further, a reversed phase input terminal of the A/D converter 9 is connected to the voltage $V_B$ via a common mode voltage detection switch 8b. Further, the output of the A/D converter 9 is input to a switch 10, and an output of the switch 10 serves as a sensor output. The output of the A/D converter 9 is input to a digital control unit 12 via a switch 11. An output $D_{CAL}$ of the digital control unit 12 is input to the digitally controlled variable capacitors 2a and 2b.

Next, an operation of the circuit of FIG. 1 will be described. The movable electrode of the detection MEMS capacitive element 1a and the movable electrode of the detection MEMS capacitive element 1b are mechanically coupled to move as one body and mechanically function as one weight (a mass body). When a signal such as acceleration is not applied to the sensor, since no force such as inertial force acts on the weight, the weight, that is, the movable electrode of the detection MEMS capacitive element 1a and the movable electrode of the detection MEMS capacitive element 1b are positioned at initial positions. At this time, since an electrode structure is designed so that a distance between the movable electrode and the fixed electrode of the detection MEMS capacitive element 1a is equal to a distance between the movable electrode and the fixed electrode of the detection MEMS capacitive element 1b, the capacitance values of the detection MEMS capacitive element 1a and the detection MEMS capacitive element 1b are equal to each other, and the values thereof are indicated by C.

If a signal such as acceleration is applied to the sensor, the weight receives force such as an inertial force proportional to the signal such as the acceleration, and thus the weight, that is, the positions of the movable electrode of the detection MEMS capacitive element 1a and the movable electrode of the detection MEMS capacitive element 1b are displaced as one body in proportion to the signal such as the acceleration. Accordingly, if the movable electrode of the detection MEMS capacitive element 1a is displaced to approach the fixed electrode of the detection MEMS capacitive element 1a, the movable electrode of the detection MEMS capacitive element 1b conversely gets away from the fixed electrode of the detection MEMS capacitive element 1b by the same displacement amount. Further, if the movable electrode of the detection MEMS capacitive element 1a is displaced to get away from the fixed electrode of the detection MEMS capacitive element 1a, the movable electrode of the detection MEMS capacitive element 1b conversely approaches the fixed electrode of the detection MEMS capacitive element 1b by the same displacement amount. If the displacement amount, that is, the capacitance value change according to the change amount of the plate interval is indicated by $\Delta C$, the capacitance value of the detection MEMS capacitive element 1a becomes $C+\Delta C$, and the capacitance value of the detection MEMS capacitive element 1b becomes $C-\Delta C$.

Figure 3:
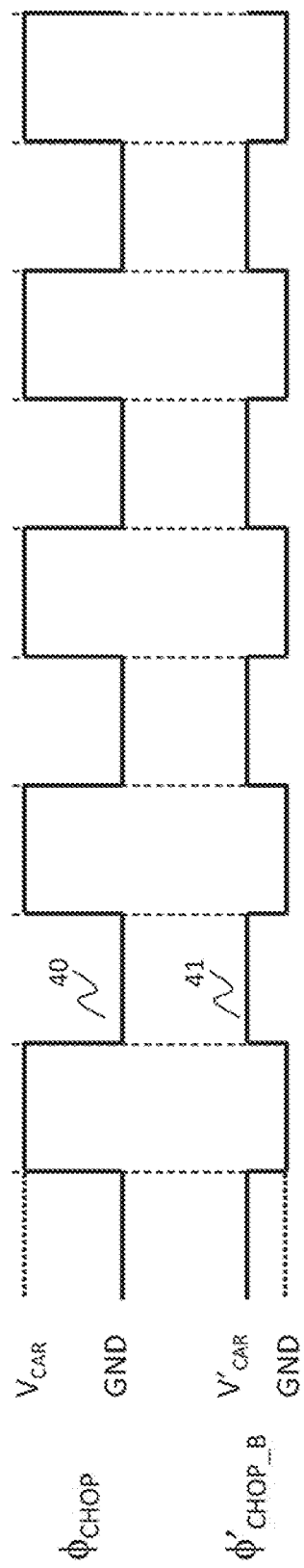
FIG. 3 is an operation timing diagram of the first embodiment of the present invention.

FIG. 3 illustrates waveforms of a carrier clock 40 and a signal 41 applied to the digitally controlled variable capacitor (common mode voltage adjustment capacitors) 2a and 2b used in the present embodiment. A phase of $\phi_{CHOP\_B}$ of a signal 42 applied to the digitally controlled variable capacitors 2a and 2b is inverted from $\phi_{CHOP}$ of the carrier clock 40, and the voltage level is decided in accordance with the common mode voltage compensation range. The signal 41 applied to the carrier clock 40 and the digitally controlled variable capacitors 2a and 2b is assumed to be input between an adjustment mode and a normal mode to be described below.

Next, an operation in a period (the adjustment mode) in which the capacitance value $C_{DIG}$ is decided will be described. In the adjustment mode, the common mode voltage generation switches 17a and 17b are turned on. Accordingly, an average voltage of a normal phase side output voltage (an output voltage of the operational amplifier 3a) and a reversed phase side output voltage (an output voltage of the operational amplifier 3b) of the CV conversion amplifier, that is, the output common mode voltage level $V_{CMO}$ of the CV conversion amplifier (=the center voltage level of the outputs of the respective operational amplifiers 3a and 3b) is generated at the joint node 200 of the common mode voltage detection resistors 6a and 6b. Further, in the adjustment mode, the common mode voltage detection switches 8a and 8b are turned on, and the output common mode voltage level $V_{CMO}$ of the CV conversion amplifier generated at the joint node 200 is input to the normal phase input terminal of the A/D converter 9 via a filter 18a, and the voltage $V_B$ is input to the reversed phase input terminal of the A/D converter 9 via a filter 18b. The filters 18a and 18b are, for example, low-pass filters for extracting a frequency band necessary for detecting a physical quantity and have a function of passing, for example, a band of 1 MHz or less.

In the adjustment mode, since the differential voltage detection switches 7a and 7b are turned off, the outputs of the operational amplifiers 3a and 3b of the CV conversion amplifier are not input to the A/D converter 9 via the filters 18a and 18b. The A/D converter 9 converts a difference voltage between the voltage of the normal phase input terminal and the voltage of the reversed phase input terminal, that is, a difference between the output common mode voltage levels $V_{CMO}$ and $V_B$ of the CV conversion amplifier, that is, $V_{CMO}-V_{DD}/2$ into a digital value. Here, $V_B$ is $V_{DD}/2$, but other voltage values may be used as well.

The digital value is supplied to the digital control unit 12. In a case in which the digital value is positive, this means that the current common mode voltage level $V_{CMO}$ of the CV conversion amplifier is higher than $V_{DD}/2$. In this case, the digital control unit 12 updates the currently output digital compensation value $D_{CAL}$ to a larger value and outputs it. On the other hand, in a case in which the digital value is negative, this means that the output common mode voltage level $V_{CMO}$ of the current CV conversion amplifier is lower than $V_{DD}/2$. In this case, the digital control unit 12 updates the currently output digital compensation value $D_{CAL}$ to a smaller value and outputs it.

Further, the digitally controlled variable capacitors 2a and 2b convert the digital compensation value $D_{CAL}$ supplied from the digital control unit 12 into the capacitance value $C_{DIG}$. In a case in which the current output common mode voltage level $V_{CMO}$ of the CV conversion amplifier is higher than $V_{DD}/2$, $D_{CAL}$ increases, and thus the capacitance value $C_{DIG}$ increases as well. As a result, the output common mode voltage level $V_{CMO}$ of the CV conversion amplifier moves in a direction in which it gets lower than now. On the other hand, in a case in which the output common mode voltage level $V_{CMO}$ of the current CV conversion amplifier is lower than $V_{DD}/2$, $D_{CAL}$ decreases, and thus the capacitance value $C_{DIG}$ decreases as well. As a result, the output common mode voltage level $V_{CMO}$ of the CV conversion amplifier moves in a direction in which it gets higher than now. With the above negative feedback control, the capacitance value $C_{DIG}$ ultimately converges to an appropriate capacitance value $C_{DIG\_FINAL}$, and the output common mode voltage level $V_{CMO}$ of the CV conversion amplifier is sufficiently close to $V_{DD}/2$.

Next, an operation in the normal operation period (normal mode) will be explained. In the normal mode, the CV conversion amplifier converts the MEMS capacitance change $\Delta C$ caused by the signal such as the acceleration applied to the sensor into the voltage signal $\Delta V$ by employing the appropriate capacitance value $C_{DIG\_FINAL}$ as a correction capacitance. The voltage signal $\Delta V$ is the output differential voltage of the CV conversion amplifier. When $C_{DIG\_FINAL}$ is employed, the output common mode voltage level of the CV conversion amplifier is set near $V_{DD}/2$, and thus an input signal to a sufficiently large sensor can be normally converted to a voltage signal.

In the normal mode, the differential voltage detection switches 7a and 7b in the ON state, the output of the operational amplifier 3a of the CV conversion amplifier is connected to the normal phase input terminal of the A/D converter 9 via the filter 18a, and the output of the operational amplifier 3b is connected to the reversed phase input terminal of the A/D converter 9 via the filter 18b. Accordingly, the output differential voltage of CV conversion amplifier is converted into the digital value through the A/D converter 9.

Figure 4:
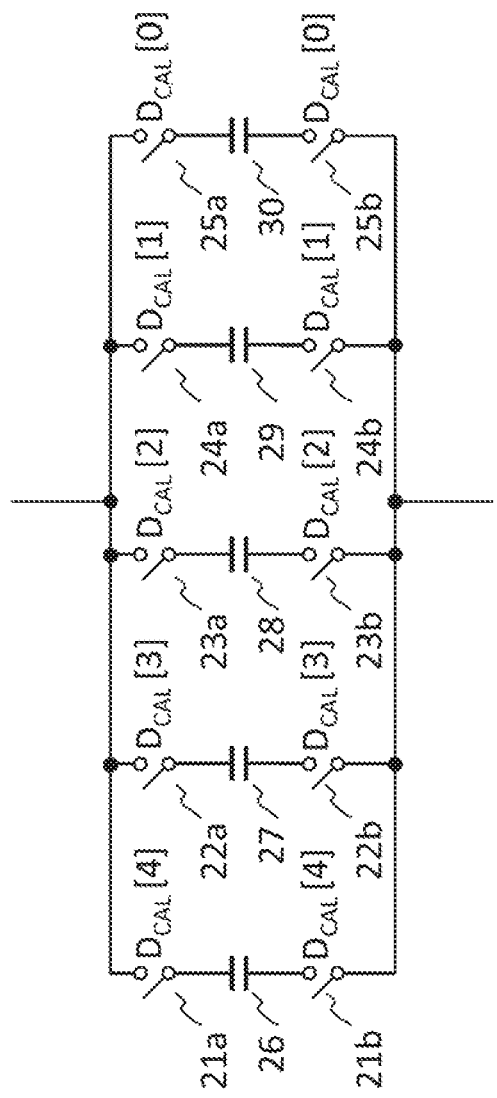
FIG. 4 is a circuit diagram for supplementarily describing the first embodiment of the present invention.

FIG. 4 illustrates an implementation example of the digitally controlled variable capacitors 2a and 2b. This is a configuration of a so-called binary capacitor array, and FIG. 4 is an example in which it is implemented with 5 bits. Capacitive elements 26, 27, 28, 29 and 30 have capacitance values of 16 Cu, 8 Cu, 4 Cu, 2 Cu, and Cu and are selected by capacitor selection switches (21a, 21b), (22a, 22b), (23a, 23b), (24a, 24b), and (25a, 25b), respectively. It is controlled whether the capacitor selection switches (21a, 21b), (22a, 22b), (23a, 23b), (24a, 24b), and (25a, 25b) are turned on or off in accordance with $D_{CAL}[4]$, $D_{CAL}[3]$, $D_{CAL}[2]$, $D_{CAL}[1]$, and $D_{CAL}[0]$. Accordingly, a variable capacitance value of n*Cu can be implemented in accordance with a $D_{CAL}[4:0]$ value n (n=0 to 31) which is a signal indicated by the digital value.

The adjustment mode can be executed before the normal mode. For example, the adjustment mode can be executed when the capacitive sensor is shipped or just after the capacitive sensor is powered on. Further, the adjustment mode may be executed twice or more. For example, when the adjustment mode is periodically executed, it is possible to cope with a temporal signal change such as aging.

After the digitally controlled variable capacitors 2a and 2b are set through the adjustment mode, a physical quantity such as acceleration is measured through the normal mode. A detection principle in the normal mode of the present embodiment is a continuous time type and basically similar to a non-continuous time type (switch type) CV conversion amplifier described in FIG. 1. Here, since the digitally controlled variable capacitors 2a and 2b are connected, the output common mode voltage level $V_{CMO}$ ($V_{OUTP}+V_{OUTN}$)/2) of (Math. 4) is changed as in (Math. 5). If the digitally controlled variable capacitors 2a and 2b are set so that a second term and a third term on the right side of (Math. 5) are negated by the adjustment mode, the output common mode voltage level $V_{CMO}$ of the CV conversion amplifier is sufficiently close to the center voltage $V_{DD}/2$.

$$V_{CMO} = V_B + V_{CAR} \cdot \frac{C}{C_F} - V'_{CAR} \cdot \frac{C_{DIG}}{C_F} \quad \text{[Math. 5]}$$

In the scheme of the present embodiment, unlike the analog correction scheme using the common mode feedback circuit of the related art, the analog circuit need not operate continuously in the common mode voltage control, and thus low power consumption can be implemented. Further, since the feedback control can be implemented digitally, it is possible to implement the control unit with a small area and low power consumption as compared with the analog scheme.

In the first embodiment, the A/D converter 9 is shared by switching the adjustment mode and the normal mode through the switch, and in the adjustment mode, the voltage in which the common mode voltage level of the output voltage of the CV conversion amplifier is reflected is used as the input voltage of the A/D converter 9, and in the normal mode, the voltage in which the change in the capacitance value of the detection MEMS capacitive element 1 is used as the input voltage of the A/D converter 9. However, it is also possible to install two or more A/D converters for the respective modes instead of sharing the A/D converter 9.

Second Embodiment

Figure 5:
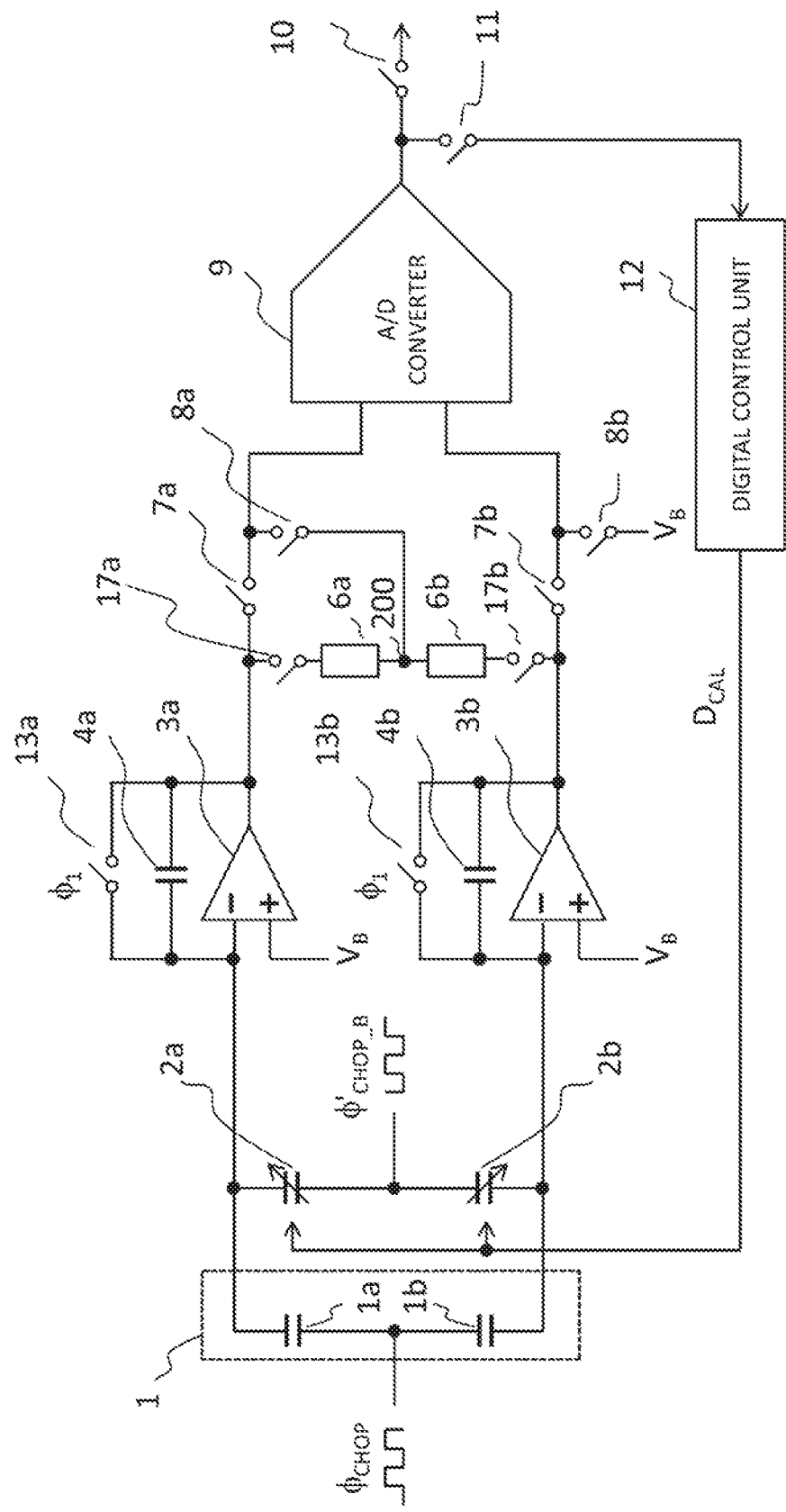
FIG. 5 is a circuit diagram illustrating a second embodiment of the present invention.

FIG. 5 illustrates a second embodiment of the present invention. A difference from the first embodiment lies in that the filters 18a and 18b are not installed, and switches 13a and 13b are installed instead of the resistive element 5a (the resistance value $R_F$) and 5b (the resistance value $R_F$) installed between the inverting input terminal and the output terminal of the operational amplifiers 3a and 3b. Accordingly, it operates as a so-called non-continuous time type (switch type) CV conversion amplifier.

In the description of the second and later embodiments, the same parts as or parts having similar functions to those of the first embodiment are denoted by the same reference numerals, and duplicate description will be omitted, and the description will proceed with different parts.

As illustrated in FIG. 5, in the second embodiment, the feedback capacitive element 4a (capacitance value $C_F$) and 4b (capacitance value $C_F$) and the switches 13a and 13b are installed between the inverting input terminals and the output terminals of the operational amplifiers 3a and 3b. The switches 13a and 13b are connected to the clock signal $\phi_1$. In the configuration of the second embodiment, the digitally controlled variable capacitors 2a (a capacitance value $C_{DIG}$) and 2b (a capacitance value $C_{DIG}$) are connected in parallel to the detection MEMS capacitive elements 1a and 1b as in the first embodiment.

The outputs of the operational amplifiers 3a and 3b of the CV conversion amplifier are connected to the differential input terminal of the A/D converter 9 via the differential voltage detection switches 7a and 7b. The common mode voltage detection resistors 6a and 6b are inserted in series between the outputs of the operational amplifiers 3a and 3b via the common mode voltage generation switches 17a and 17b, and the common mode voltage detection resistors 6a and 6b are connected to the normal phase input terminal of the A/D converter 9 via the common mode voltage detection switch 8a. Further, the reversed phase input terminal of the A/D converter 9 is connected to the voltage $V_B$ via the common mode voltage detection switch 8b. Further, the output of the A/D converter 9 is input to the switch 10, and the output of the switch 10 serves as the sensor output. The output of the A/D converter 9 is input to the digital control unit 12 via the switch 11. The output $D_{CAL}$ of the digital control unit 12 is input to the digitally controlled variable capacitors 2a and 2b.

Next, an operation of the circuit of FIG. 5 will be described. The detection MEMS capacitive elements 1a and 1b have a similar configuration as in the first embodiment, and if the capacitance value change caused by the change amount of the plate interval is ΔC, a capacitance value of the detection MEMS capacitive element 1a is C+ΔC, and a capacitance value of the detection MEMS capacitive element 1b is C−ΔC.

Figure 6:
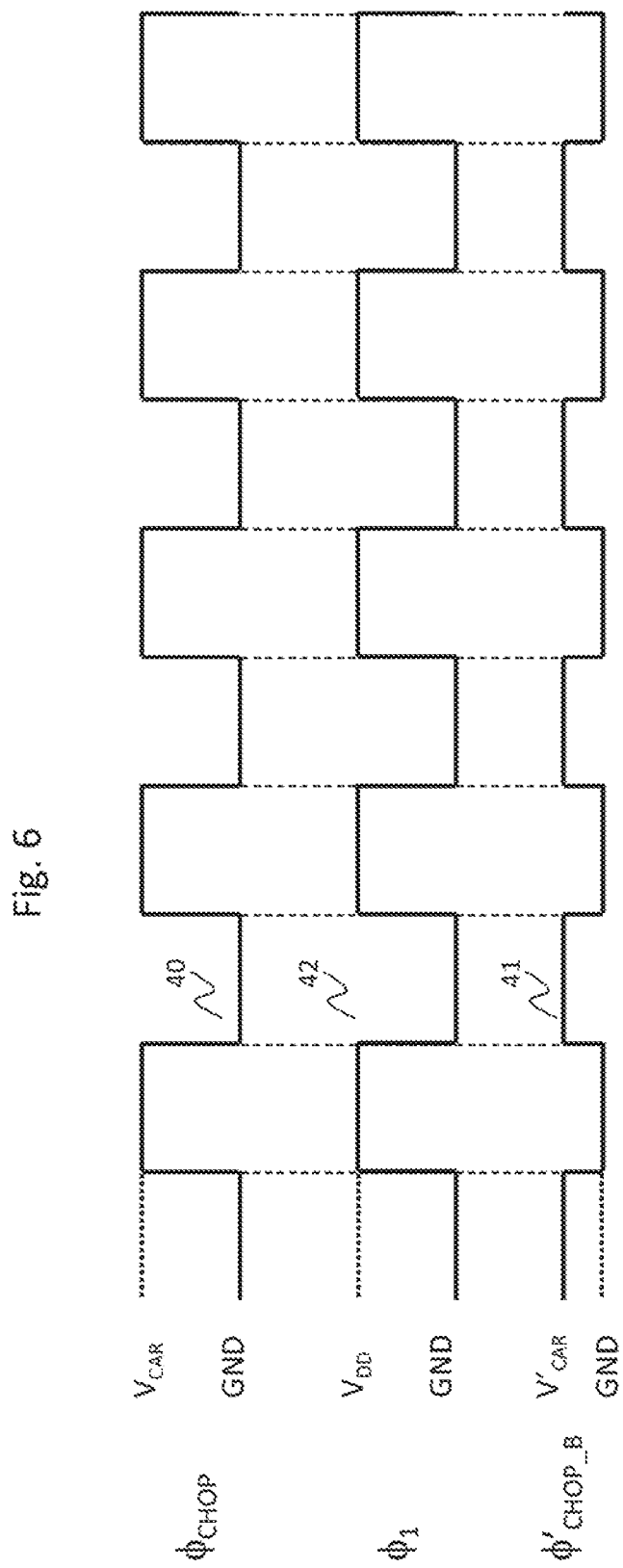
FIG. 6 is an operation timing diagram of the second embodiment of the present invention.

FIG. 6 illustrates waveforms of a carrier clock 40, a signal 41 applied to the digitally controlled variable capacitors 2a and 2b, and a clock signal 42 used in the present embodiment. In the clock signal 42, the switches 13a and 13b are turned on when a high potential signal (for example, $V_{DD}$) is input and turned off when a low potential signal (for example, GND) is input. Further, a phase of $\phi'_{CHOP\_B}$ of the signal 41 applied to the digitally controlled variable capacitors 2a and 2b is inverted from $\phi_{CHOP}$ of the carrier clock 40, and the voltage level is decided in accordance with the common mode voltage compensation range.

Here, a high voltage value of the carrier clock $\phi_{CHOP}$ is $W_{AR}$, a high voltage value of $\phi'_{CHOP\_B}$ connected to the digitally controlled variable capacitors 2a and 2b is indicated by $V'_{CAR}$, and a voltage of the node connected to the inverting input terminal of the first operational amplifier is $V_B=V_{DD}/2$.

Next, an operation in a period (the adjustment mode) in which the capacitance value $C_{DIG}$ is decided will be described with reference to FIG. 5. In the adjustment mode, the common mode voltage generation switches 17a and 17b are turned on. Accordingly, similarly to the first embodiment, the output common mode voltage level $V_{CMO}$ of the CV conversion amplifier (=the center voltage level of the output of each of the operational amplifiers 3a and 3b) is generated in the joint node 200 of the common mode voltage detection resistors 6a and 6b. Further, in the adjustment mode period, the common mode voltage detection switches 8a and 8b are turned on, and the output common mode voltage level $V_{CMO}$ of the CV conversion amplifier generated at the joint node 200 is input to the normal phase input terminal of the A/D converter 9, and the voltage $V_B$ is input to the reversed phase input terminal of the A/D converter 9. In the adjustment mode period, since the differential voltage detection switches 7a and 7b are turned off, the outputs of the operational amplifiers 3a and 3b of the CV conversion amplifier are not input to the A/D converter 9. The A/D converter 9 converts a difference voltage between the voltage of the normal phase input terminal and the voltage of the voltage of the reversed phase input terminal, that is, a difference between the output common mode voltage levels $V_{CMO}$ and $V_B$ of the CV conversion amplifier, that is, $V_{CMO}-V_{DD}/2$ into a digital value. Here, $V_B$ is $V_{DD}/2$, but other voltage values may be used as well.

The digital value is supplied to the digital control unit 12. Similarly to the case of the first embodiment, with the negative feedback control, the capacitance value $C_{DIG}$ ultimately converges to an appropriate capacitance value $C_{DIG\_FINAL}$, and the output common mode voltage level $V_{CMO}$ of the CV conversion amplifier is sufficiently close to $V_{DD}/2$.

Next, an operation of in normal operation period (normal mode) will be described. In the normal operation period, the CV conversion amplifier converts the MEMS capacitance change ΔC caused by the signal such as the acceleration applied to the sensor into the voltage signal ΔV by employing the appropriate capacitance value $C_{DIG\_FINAL}$ set in the adjustment mode as a correction capacitance. The voltage signal ΔV is the output differential voltage of the CV conversion amplifier. When $C_{DIG\_FINAL}$ is employed, the output common mode voltage level of the CV conversion amplifier is set near $V_{DD}/2$, and thus an input signal to a sufficiently large sensor can be normally converted to a voltage signal.

During the period of the normal mode, the differential voltage detection switches 7a and 7b in the ON state, the output of the operational amplifier 3a of the CV conversion amplifier is connected to the normal phase input terminal of the A/D converter 9 via the filter 18a, and the output of the operational amplifier 3b is connected to the reversed phase input terminal of the A/D converter 9 via the filter 18b. Accordingly, the output differential voltage of CV conversion amplifier is converted into the digital value through the A/D converter 9. As an implementation example of the digitally controlled variable capacitors 2a and 2b, the configuration of FIG. 4 can be used like the embodiment 1.

The present scheme is a non-continuous time type (switch type) detection scheme, unlike the analog correction scheme using the common mode feedback circuit of the related art, the scheme of the present embodiment can implement low power consumption because it is not necessary for the analog circuit to constantly operate continuously in the common mode voltage control. Further, since the feedback control can be implemented digitally, it is possible to implement the control unit with a small area and low power consumption as compared with the analog scheme.

Third Embodiment

Figure 7:
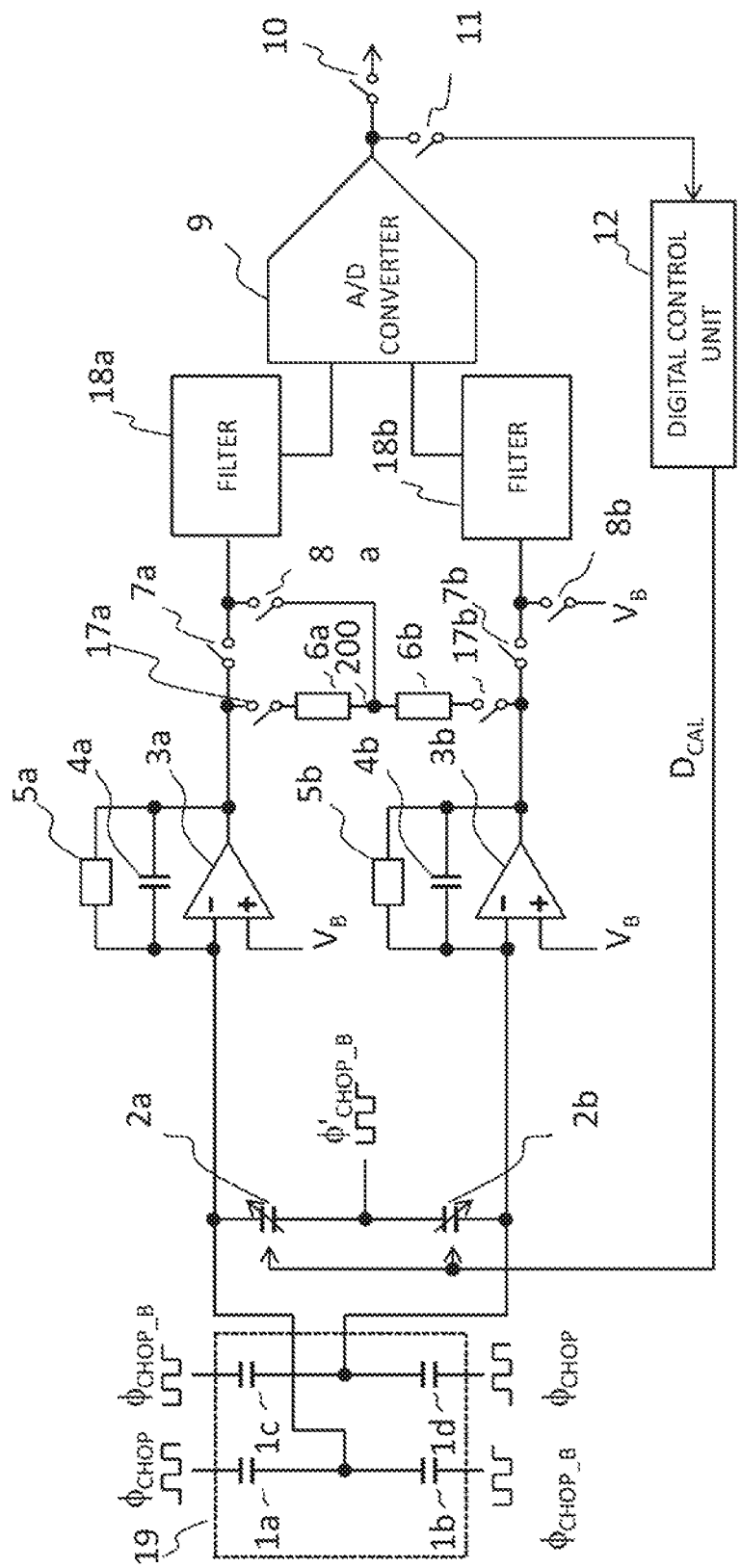
FIG. 7 is a circuit diagram illustrating a third embodiment of the present invention.

FIG. 7 illustrates a third embodiment of the present invention. In the present embodiment, the capacitive MEMS 1 of the first embodiment is replaced with a capacitive MEMS 19. The capacitive MEMS 19 includes four detection MEMS capacitive elements 1a, 1b, 1c, and 1d. In a case in which servo control is performed, an MEMS capacitive element for applying servo force may be further installed. In this case, of course, the present invention is effective as well.

A structure of a first pair including the detection MEMS capacitive elements 1a and 1b and a structure of a second pair including a pair of detection MEMS capacitive elements 1c and 1d are designed to be as identical as possible to each other.

Further, movable electrodes of the detection MEMS capacitive elements 1a, 1b, 1c, and 1d are operational amplifier side electrodes of the capacitive elements, unlike the first to the second embodiments. On the other hand, the fixed electrodes of the detection MEMS capacitive elements 1a, 1b, 1c, and 1d are connected to the carrier clock $\phi_{CHOP}$, the inversed carrier clock $\phi_{CHOP\_B}$, the inversed carrier clock $\phi_{CHOP\_B}$, and the carrier clock $\phi_{CHOP}$, respectively.

The movable electrode of the detection MEMS capacitive element 1a, the movable electrode of the detection MEMS capacitive element 1b, the movable electrode of the detection MEMS capacitive element 1c, and the movable electrode of the detection MEMS capacitive element 1d are mechanically coupled to move as one body and functions as one weight (a mass body). When the signal such as the acceleration is not applied to the sensor, since no force such as inertial force acts on the weight, the weight, that is, the movable electrode of the detection MEMS capacitive element 1a, the movable electrode of the detection MEMS capacitive element 1b, the weight, that is, the movable electrode of the detection MEMS capacitive element 1c, and the movable electrode of the detection MEMS capacitive element 1d are positioned at initial positions.

When positioned at the initial positions, since an electrode structure is designed so that a distance between the movable electrode and the fixed electrode of the detection MEMS capacitive element $1a$ is equal to a distance between the movable electrode and the fixed electrode of the detection MEMS capacitive element $1b$, the capacitance values of the detection MEMS capacitive element $1a$ and the detection MEMS capacitive element $1b$ are equal to each other, but practically, the capacitance values of the detection MEMS capacitive element $1a$ and the detection MEMS capacitive element $1b$ are not equal to each other due to parasitic capacitance, a manufacturing variation of MEMS, or the like, the capacitance value of the detection MEMS capacitive element $1a$ is indicated by $C+C_{DC}+C_{DC2}$, and the capacitance value of the detection MEMS capacitive element $1b$ is indicated by $C-C_{DC}-C_{DC2}$.

Similarly, when positioned at the initial positions, since an electrode structure is designed so that a distance between the movable electrode and the fixed electrode of the detection MEMS capacitive element $1c$ is equal to a distance between the movable electrode and the fixed electrode of the detection MEMS capacitive element $1d$, the capacitance values of the detection MEMS capacitive element $1c$ and the detection MEMS capacitive element $1d$ are equal to each other, but practically, the capacitance values of the detection MEMS capacitive element $1c$ and the detection MEMS capacitive element $1d$ are not equal to each other due to parasitic capacitance, a manufacturing variation of MEMS, or the like, the capacitance value of the detection MEMS capacitive element $1c$ is indicated by $C-C_{DC}+C_{DC2}$, and the capacitance value of the detection MEMS capacitive element $1d$ is indicated by $C+C_{DC}-C_{DC2}$.

In other words, the capacitance values Ca, Cb, Cc, and Cd of the respective MEMS capacitive elements $1a$, $1b$, $1c$, and $1d$ can be indicated as follows without loss of generality.

$$Ca=C+C_{DC}+C_{DC2},\ Cb=C-C_{DC}-C_{DC2}$$

$$Cc=C-C_{DC}+C_{DC2},\ Cd=C+C_{DC}-C_{DC2}$$

Here, $C_{DC}$ is a component affecting the deviation of the center value in the MEMS capacitance variation, and $C_{DC2}$ is a component that does not affect the deviation of the center value in the MEMS capacitance variation. The reason will be described.

In the MEMS capacitive element $1a$, $1b$, $1c$, and $1d$, since the carrier clock $\phi_{CHOP}$ is applied to $1a$ and $1d$, and the inversed carrier clock $\phi_{CHOP\_B}$ is applied to $1b$ and $1c$, the following charges are induced to the input nodes of the operational amplifiers $3a$ and $3b$.

$$(Ca-Cb)V_{CAR}=2(C_{DC}+C_{DC2})V_{CAR}$$

$$-(Cc-Cd)V_{CAR}=2(C_{DC}-C_{DC2})V_{CAR}$$

However, it is assumed that there is no capacitance change ΔC caused by an acceleration signal. As can be seen from the above formula, since $C_{DC2}$ is output as the differential signal, it does not affect the deviation of the center voltage level, but because $C_{DC}$ is output as the common mode signal, it causes a deviation of the center voltage level. Therefore, in the following description, $C_{DC2}$ is not included in each capacitance value, but, of course, the present invention is effective regardless of the presence or absence of $C_{DC2}$.

If a signal such as acceleration is applied to the sensor, the weight receives force such as an inertial force proportional to the signal such as the acceleration, and thus the weight, that is, the positions of the movable electrode of the detection MEMS capacitive element $1a$, the movable electrode of the detection MEMS capacitive element $1b$, the movable electrode of the detection MEMS capacitive element $1c$, and the movable electrode of the detection MEMS capacitive element $1d$ are displaced as one body in proportion to the signal such as the acceleration. Accordingly, if the movable electrode of the detection MEMS capacitive element $1a$ is displaced to approach the fixed electrode of the detection MEMS capacitive element $1a$, the movable electrode of the detection MEMS capacitive element $1b$ conversely gets away from the fixed electrode of the detection MEMS capacitive element $1b$ by the same displacement amount. Further, if the movable electrode of the detection MEMS capacitive element $1a$ is displaced to get away from the fixed electrode of the detection MEMS capacitive element $1a$, the movable electrode of the detection MEMS capacitive element $1b$ conversely approaches the fixed electrode of the detection MEMS capacitive element $1b$ by the same displacement amount. Similarly, if the movable electrode of the detection MEMS capacitive element $1c$ is displaced to approach the fixed electrode of the detection MEMS capacitive element $1c$, the movable electrode of the detection MEMS capacitive element $1d$ conversely gets away from the fixed electrode of the detection MEMS capacitive element $1d$ by the same displacement amount. Further, if the movable electrode of the detection MEMS capacitive element $1c$ is displaced to get away from the fixed electrode of the detection MEMS capacitive element $1c$, the movable electrode of the detection MEMS capacitive element $1d$ conversely approaches the fixed electrode of the detection MEMS capacitive element $1d$ by the same displacement amount.

If the displacement amount, that is, the capacitance value change according to the change amount of the plate interval is indicated by ΔC, the capacitance value of the detection MEMS capacitive element $1a$ becomes $C+C_{DC}+\Delta C$, the capacitance value of the detection MEMS capacitive element $1b$ becomes $C-C_{DC}-\Delta C$, the capacitance value of the detection MEMS capacitive element $1c$ becomes $C-C_{DC}+\Delta C$, and the capacitance value of the detection MEMS capacitive element $1d$ becomes $C+C_{DC}-\Delta C$.

Therefore, the following charges are induced to the respective input nodes of operational amplifiers $3a$ and $3b$, respectively.

$$(Ca-Cb)V_{CAR}=2(C_{DC}+\Delta C)V_{CAR}$$

$$-(Cc-Cd)V_{CAR}=2(C_{DC}-\Delta C)V_{CAR}$$

$C_{DC}$ causes a deviation of the center voltage level of the output of the operational amplifier of the CV conversion amplifier, but since the values of the digitally controlled variable capacitors $2a$ and $2b$ are adjusted during the adjustment mode described above, it is possible to compensate $C_{DC}$ and compensate the deviation of the center voltage level.

Except for the MEMS configuration described above, a configuration and an operation of the present embodiment are similar to those of the first embodiment. In other words, in the present embodiment, the values of the digitally controlled variable capacitors $2a$ and $2b$ are adjusted during the adjustment mode so that the deviations of the center voltage levels of the outputs of the operational amplifiers $3a$ and $3b$ of the CV conversion amplifier caused by $C_{DC}$ due to the variation of the detection MEMS capacitive element 1 is compensated.

Figure 8:
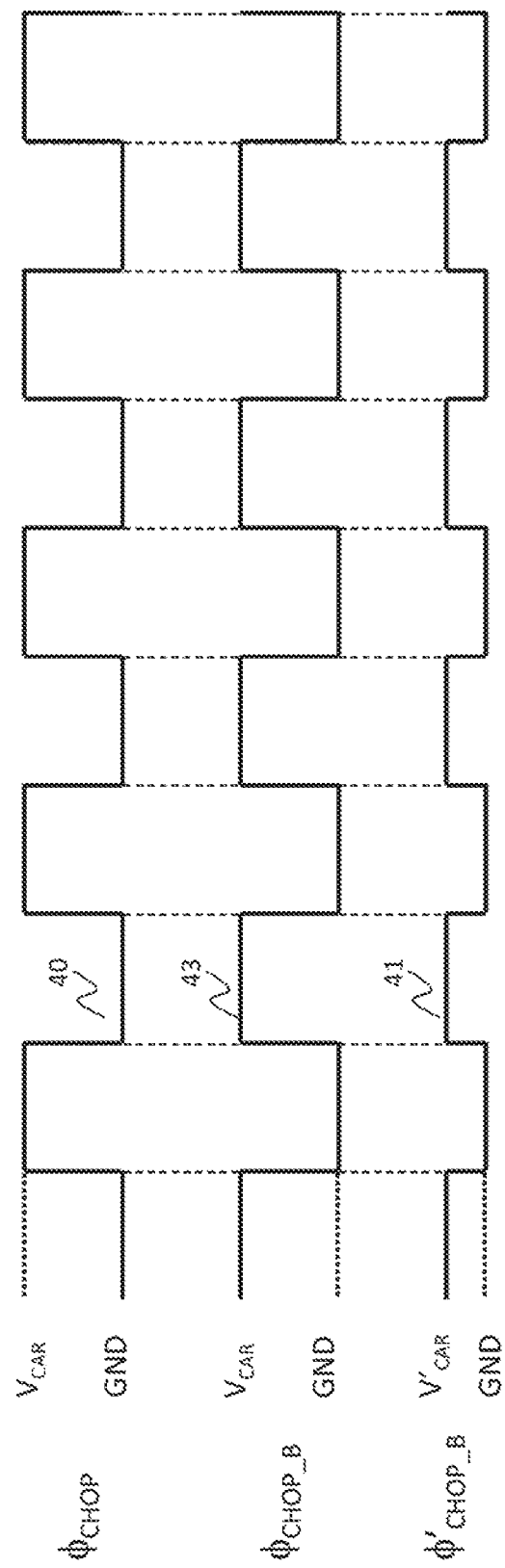
FIG. 8 is an operation timing diagram of the third embodiment of the present invention.

FIG. 8 illustrates waveforms of a carrier clock 40, a signal 41 applied to the digitally controlled variable capacitors $2a$ and $2b$, and an inversed carrier clock 43 used in the present embodiment. Further, a phase of $\phi'_{CHOP\_B}$ of the signal 41 applied to the digitally controlled variable capacitors $2a$ and 2b is inverted from $\phi_{CHOP}$ of the carrier clock 40, and the voltage level is decided in accordance with the common mode voltage compensation range. Further, a phase of $\phi_{CHOP\_B}$ of the inversed carrier clock 43 is inverted from $\phi_{CHOP}$ of the carrier clock 40, and the voltage level is the same.

Fourth Embodiment

Figure 9:
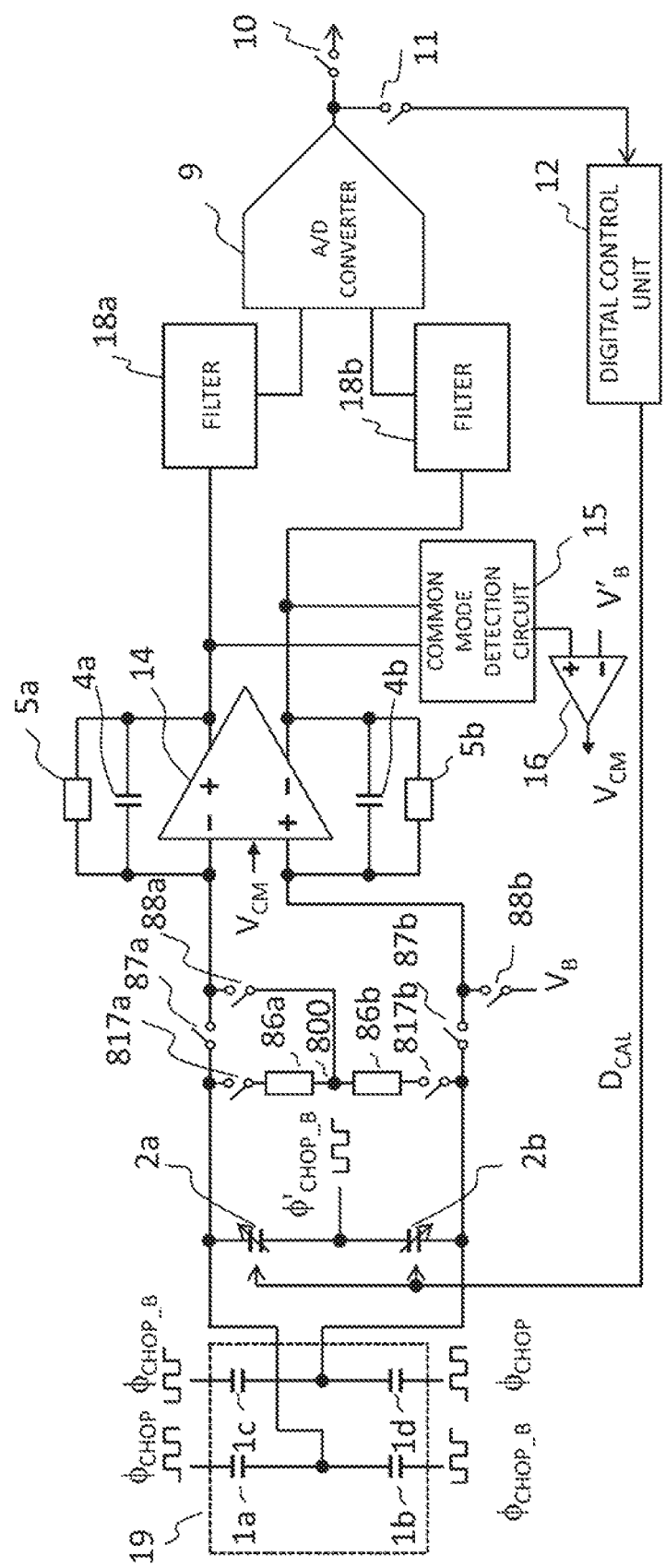
FIG. 9 is a circuit diagram illustrating a fourth embodiment of the present invention.

FIG. 9 illustrates a fourth embodiment of the present invention. In the present embodiment, the operational amplifiers 3a and 3b used in the pseudo differential CV conversion amplifier of the third embodiment are replaced with a fully differential operational amplifier 14. In this case, a common mode feedback circuit (CMFB) that performs control such that the output common mode voltage level $V_{CMO}$ of the fully differential operational amplifier 14 (=$(V_{OUTP}+V_{OUTN})/2$, where $V_{OUTP}$ and $V_{OUTN}$ are a normal phase output voltage and a reversed phase output voltage of the fully differential operational amplifier 14) has a desired voltage level (for example, $V_{DD}/2$). Therefore, in a case in which the fully differential operational amplifier is used, the output common mode voltage level $V_{CMO}$ can be set to be around $V_{DD}/2$, but in compensation, an input common mode voltage level $V_{CMI}$ of the fully differential operational amplifier (=$(V_{INP}+V_{INN})/2$, where $V_{INP}$ and $V_{INN}$ are a normal phase input voltage and a reversed phase input voltage of the fully differential operational amplifier 14 remarkably deviates from a desired voltage level.

Next, a configuration will be described. The capacitive MEMS 19 includes four detection MEMS capacitive elements 1a, 1b, 1c, and 1d (each having a capacitance value C), and one of electrodes is a movable electrode which can mechanically move. A structure of a first pair including the detection MEMS capacitive elements 1a and 1b and a structure of a second pair including a pair of detection MEMS capacitive elements 1c and 1d are designed to be as identical as possible to each other.

The movable electrodes of the detection MEMS capacitive elements 1a, 1b, 1c, and 1d are connected to first and second input terminals of the fully differential operational amplifier 14 via differential voltage detection switches 87a and 87b. On the other hand, fixed electrodes of detection MEMS capacitive elements 1a, 1b, 1c, and 1d are connected to the carrier clock $\phi_{CHOP}$, the inversed carrier clock $\phi_{CHOP\_B}$, the inversed carrier clock $\phi_{CHOP\_B}$, and the carrier clock $\phi_{CHOP}$, respectively.

Common mode voltage detection resistors 86a and 86b are inserted in series between common mode voltage generation switches 817a and 817b between the first and second input terminals and the output terminal of the fully differential operational amplifier 14, and further, a joint node 800 of the common mode voltage detection resistors 86a and 86b is connected to the first input terminal of the fully differential operational amplifier 14 via a common mode voltage detection switch 88a. Further, the second input terminal of the fully differential operational amplifier 14 is connected to the voltage $V_B$ via a common mode voltage detection switch 88b.

The feedback capacitive elements 4a (a capacitance value $C_F$) and 4b (a capacitance value $C_F$) and the resistive element 5a (a resistance value $R_F$) and 5b (a resistance value $R_F$) are installed between the first and second input terminals and the output terminal of the fully differential operational amplifier 14. Further, in the present configuration, the digitally controlled variable capacitors 2a (a capacitance value $C_{DIG}$) and 2b (a capacitance value $C_{DIG}$) are connected in parallel with the detection MEMS capacitive elements 1a, 1b, 1c, and 1d. $\phi'_{CHOP\_B}$ obtained by inverting the carrier clock $\phi_{CHOP}$ and changing a level appropriately is connected to the digitally controlled variable capacitors 2a and 2b.

First and second outputs of the fully differential operational amplifier 14 are connected to first and second inputs of a common mode detection circuit 15. The common mode detection circuit 15 is a circuit that outputs an average voltage value of the two output voltages of the fully differential operational amplifier 14. An output of the common mode detection circuit 15 is connected to the non-inverting input terminal of an operational amplifier 16. A feedback circuit including the common mode detection circuit 15 and the operational amplifier 16 constitutes the common mode feedback circuit (CMFB) described above.

In the fully differential operational amplifier, since the fluctuation of the average output voltage is a problem of an amplification operation due to an element mismatch, it is necessary to install the CMFB. The CMFB detects the average output voltage through the common mode detection circuit 15 such as resistance voltage division, and amplifies a difference voltage between the average output voltage and a reference voltage $V_B$ using the operational amplifier 16. When a difference voltage $W_{CM}$ is input to a gate of a tail current source of the fully differential operational amplifier 14, a negative feedback is given, and control is performed such that the output common mode voltage level $V_{CMO}$ of the fully differential operational amplifier 14 is kept constant.

Further, the first and second outputs of the fully differential operational amplifier 14 of the CV conversion amplifier produce a balanced differential output on the basis of $V_{CMO}$. The differential outputs are connected to the differential input terminal of A/D converter 9 via the filters 18a and 18b.

Further, an output of the A/D converter 9 is input to the switch 10, and the output of the switch 10 serves as the sensor output. An output of the A/D converter 9 is input to the digital control unit 12 via the switch 11. The output $D_{CAL}$ of the digital control unit 12 is input to the digitally controlled variable capacitors 2a and 2b.

Next, an operation will be described. A configuration of the capacitive MEMS 19 is similar to that of the third embodiment. Similar to the third embodiment, when positioned at the initial positions, the capacitance values of the detection MEMS capacitive element 1a and the detection MEMS capacitive element 1b are equal to each other, but practically, the capacitance values of the detection MEMS capacitive element 1a and the detection MEMS capacitive element 1b are not equal to each other due to parasitic capacitance, a manufacturing variation of MEMS, or the like, the capacitance value of the detection MEMS capacitive element 1a is indicated by $C+C_{DC}+C_{DC2}$, and the capacitance value of the detection MEMS capacitive element 1b is indicated by $C-C_{DC}-C_{DC2}$. Similarly, the capacitance value of the detection MEMS capacitive element 1c is indicated by $C-C_{DC}+C_{DC2}$, and the capacitance value of the detection MEMS capacitive element 1d is indicated by $C+C_{DC}-C_{DC2}$. Here, $C_{DC}$ causes a deviation of the center voltage level of the output of the operational amplifier of the CV conversion amplifier, but $C_{DC2}$ does not affect the deviation of the center voltage level. Therefore, in the following description, $C_{DC2}$ is not included in each capacitance value.

When the signal such as the acceleration is applied to the sensor, If the displacement amount according to the acceleration, that is, the capacitance value change according to the change amount of the plate interval is indicated by $\Delta C$, the capacitance value of the detection MEMS capacitive element $1a$ becomes $C+C_{DC}+\Delta C$, the capacitance value of the detection MEMS capacitive element $1b$ becomes $C-C_{DC}-\Delta C$, the capacitance value of the detection MEMS capacitive element $1c$ becomes $C-C_{DC}+\Delta C$, and the capacitance value of the detection MEMS capacitive element $1d$ becomes $C+C_{DC}-\Delta C$.

Waveforms of a carrier clock 40, a signal 41 applied to the digitally controlled variable capacitors $2a$ and $2b$, and an inversed carrier clock 43 used in the present embodiment are identical to those illustrated in FIG. 8.

Next, an operation in a period (the adjustment mode) in which the capacitance value $C_{DIG}$ is determined will be described. In the adjustment mode period, the common mode voltage generation switches $817a$ and $817b$ are turned on. Accordingly, an average voltage of the normal phase side input voltage of the CV conversion amplifier (the first input voltage of the fully differential operational amplifier 14) and the reversed phase side input voltage (the second input voltage of the fully differential operational amplifier 14), that is, the input common mode voltage level $V_{CMI}$ of the CV conversion amplifier is generated at the joint node 800 of the common mode voltage detection resistors $86a$ and $86b$.

Further, in the adjustment mode period, the common mode voltage detection switches $88a$ and $88b$ are turned on, the input common mode voltage level $V_{CMI}$ of the CV conversion amplifier generated at the joint node 800 is input to the first input terminal of the fully differential operational amplifier 14, and the voltage $V_B$ is input to the second input terminal of the fully differential operational amplifier 14. In the adjustment mode period, the differential voltage detection switches $87a$ and $87b$ are turned off.

The A/D converter 9 converts a difference voltage between the voltage of the normal phase input terminal and the voltage of the voltage of the reversed phase input terminal, that is, a difference between the output common mode voltage levels $V_{CMO}$ and $V_B$ of the CV conversion amplifier, that is, $V_{CMO}-V_{DD}/2$ into a digital value. Here, $V_B$ is $V_{DD}/2$, but other voltage values may be used as well.

Since the value of the difference voltage which is the output of the fully differential operational amplifier 14 is not affected by the output common mode voltage level $V_{CMO}$, the common mode feedback circuit (CMFB) including the common mode detection circuit 15 and the like may operate even in the adjustment mode.

The digital value is supplied to the digital control unit 12. In a case in which the digital value is positive, it means that the input common mode voltage level $V_{CMI}$ of the current CV conversion amplifier is higher than $V_{DD}/2$. In this case, the digital control unit 12 updates the currently output digital compensation value $D_{CAL}$ to a larger value and outputs it. On the other hand, in a case in which the digital value is negative, it means that the input common mode voltage level $V_{CMI}$ of the current CV conversion amplifier is lower than $V_{DD}/2$. In this case, the digital control unit 12 updates the currently output digital compensation value $D_{CAL}$ to a smaller value and outputs it.

Further, the digitally controlled variable capacitors $2a$ and $2b$ convert the digital compensation value $D_{CAL}$ supplied from the digital control unit 12 into the capacitance value $C_{DIG}$. In a case in which the current input common mode voltage level $V_{CMO}$ of the CV conversion amplifier is higher than $V_{DD}/2$, $D_{CAL}$ increases, and thus the capacitance value $C_{DIG}$ increases as well. As a result, the input common mode voltage level $V_{CMI}$ of the CV conversion amplifier moves in a direction in which it gets lower than now. On the other hand, in a case in which the current common mode voltage level $V_{CMI}$ of the CV conversion amplifier is lower than $V_{DD}/2$, $D_{CAL}$ decreases, and thus the capacitance value $C_{DIG}$ decreases as well. As a result, the input common mode voltage level $V_{CMO}$ of the CV conversion amplifier moves in a direction in which it gets higher than now. With the above negative feedback control, the capacitance value $C_{DIG}$ ultimately converges to an appropriate capacitance value $C_{DIG\_FINAL}$, and the output common mode voltage level $V_{CMO}$ of the CV conversion amplifier is sufficiently close to $V_{DD}/2$.

Next, an operation in the normal operation period (normal mode) will be described. In the normal mode, the CV conversion amplifier converts the MEMS capacitance change $\Delta C$ caused by the signal such as the acceleration applied to the sensor into the voltage signal $\Delta V$ by employing the appropriate capacitance value $C_{DIG\_FINAL}$ as a correction capacitance. The voltage signal $\Delta V$ is the output differential voltage of the CV conversion amplifier. When $C_{DIG\_FINAL}$ is employed, the input common mode voltage level of CV conversion amplifier is set near $V_{DD}/2$, and the output common mode voltage level is kept constant by the common mode feedback circuit including the common mode detection circuit 15 and the operational amplifier 16, and thus an input signal to a sufficiently large sensor can be normally converted to a voltage signal.

In the normal operation period, the differential voltage detection switches $7a$ and $7b$ are turned on, the first output of the fully differential operational amplifier 14 of the CV conversion amplifier is connected to the normal phase input terminal of the A/D converter 9 via the filter $18a$, and the second output of the operational amplifier 14 is connected to the reversed phase input terminal of the A/D converter 9 via the filter $18b$. Accordingly, the output differential voltage of CV conversion amplifier is converted into the digital value through the A/D converter 9.

As an implementation example of the digitally controlled variable capacitors $2a$ and $2b$, the configuration of FIG. 4 can be used. In the present scheme, in a case in which the deviation of the input common mode voltage level is corrected in the fully differential operational amplifier using the common mode feedback circuit, unlike the analog correction scheme, the analog circuit need not operate continuously in the common mode voltage control, and thus low power consumption can be implemented. Further, since the feedback control can be implemented digitally, it is possible to implement the control unit with a small area and low power consumption as compared with the analog scheme.

As various kinds of switches in the embodiments described above, various switches such as a complementary type switch in which an NMOS and a PMOS are connected in parallel, a switch including only an NMOS, and a switch including only a PMOS can be used. For the sake of convenience of description, in any case, it is assumed that the clock signal of controlling the switch is in the ON state in a case in which it is a high voltage and in the OFF state in a case in which it is a low voltage.

According to the embodiments described above in detail, since the detection of the common mode voltage is performed by performing the resistance voltage division of the differential output signal of the CV amplifier, the common mode component can be detected with a high degree of accuracy. Further, since the A/D converter originally included in the digital electrostatic capacitive sensor can be used, there is not necessary to use a new A/D converter when the adjustment voltage is converted into the digital value. The adjustment value can be held digitally, and unlike the adjustment by the analog circuit, it is not necessary to operate constantly, and it is possible to perform the adjustment with low power consumption. In addition to the normal sensor output operation, for example, it is possible to reduce the influence of the deviation of the adjustment value caused by the temperature fluctuation or the like by searching for the adjustment value once in every 100 times.

The CV conversion amplifiers and the capacitive sensors of the present invention described in the above embodiments detect, for example, the acceleration, the angular velocity, or the like, and output a sensor output signal corresponding thereto. This sensor output signal can be used in a system that performs posture control of automobiles, motorcycles, agricultural machines, or the like, secures driving stability, and prevents sideslip such as electronic stability control (ESC) or sensor systems for resource exploration.

In this specification or the like, the terms "electrode" and "wiring" do not functionally limit the components thereof. For example, the "electrode" may be used as a part of the "wiring," or vice versa. Further, the terms "electrode" and "wiring" also include a case in which a plurality of "electrodes" or a plurality of "wirings" are integrally formed or the like.

The present invention is not limited to the embodiments described above but includes various modifications. For example, it is possible to replace a part of a configuration of a certain embodiment with a configuration of another embodiment, and it is also possible to add a configuration of another embodiment to a configuration of a certain embodiment. It is also possible to perform addition, deletion, and replacement of configurations of other embodiments on a part of the configurations of each embodiment.

INDUSTRIAL APPLICABILITY

The present invention can be used for acceleration sensors or the like.

REFERENCE SIGNS LIST 1 capacitive MEMS
1a, 1b, 1c, and 1d detection MEMS capacitive element
2a, 2b digitally controlled variable capacitor
3a, 3b operational amplifier
4a, 4b feedback capacitive element
5a, 5b resistive element
6a, 6b resistive element
7a, 7b, 8a, 8b switch
9 A/D converter
10, 11 switch
12 digital control unit
13a, 13b switch
14 fully differential operational amplifier
15 common mode detection circuit
16 operational amplifier
17a, 17b switch
18a, 18b filter
19 capacitive MEMS
21a, 21b, 22a, 22b, 23a, 23b, 24a, 24b, 25a, 25b capacitor selection switch
26, 27, 28, 29, 30 capacitive element
40 carrier clock
41 signal applied to digitally controlled variable capacitors 2a and 2b
42 clock signal
43 inversed carrier clock

The invention claimed is:

1. A capacitive sensor, comprising:
first and second detection capacitors;
a CV conversion circuit that includes first and second feedback capacitors and obtains a voltage based on capacitance values of the first and second feedback capacitors;
an AD converter that performs analog digital conversion on an input voltage and obtains a digital signal;
a digital control unit that receives the digital signal as an input; and
first and second digitally controlled variable capacitors having capacitance values which are controlled by the digital control unit,
wherein, in a case in which a physical quantity serving as a measurement target is not substantially zero, capacitance values of the first and second detection capacitors are changed from capacitance values in a case in which the physical quantity is substantially zero in accordance with the physical quantity as the measurement target,
change amounts of the capacitance values of the first and second detection capacitors are opposite in sign to each other and substantially equal in an absolute value to each other,
the first and second feedback capacitors accumulate charges in which the capacitance values of the first detection capacitor, the second detection capacitor, the first digitally controlled variable capacitor, and the second digitally controlled variable capacitor are reflected, and
a common mode voltage level of an input voltage of the CV conversion circuit or a common mode voltage level of an output voltage is controlled in accordance with control of the first and second digitally controlled variable capacitors.

2. The capacitive sensor according to claim 1, wherein, in a period of an adjustment mode, a voltage in which the common mode voltage level of the input voltage of the CV conversion circuit or the common mode voltage level of the output voltage is reflected is used as an input voltage of the AD converter, and
in a period of a normal mode, a voltage based on the capacitance value of the first and second feedback capacitors is used as the input voltage of the AD converter.

3. The capacitive sensor according to claim 2, wherein the CV conversion circuit is a pseudo differential CV conversion amplifier including a first operational amplifier and a second operational amplifier,
a signal in which the capacitance values of the first detection capacitor and the first digitally controlled variable capacitor are reflected is input to an inverting input terminal of the first operational amplifier,
a signal in which the capacitance values of the second detection capacitor and the second digitally controlled variable capacitor are reflected is input to an inverting input terminal of the second operational amplifier,
a fixed voltage is input to non-inverting input terminals of the first and second operational amplifiers,
the capacitive sensor further comprises first and second resistive elements and first, second, third, fourth, fifth, and sixth switches,
the first and second resistive elements are a pair of resistive elements having substantially equal resistance values,
an output of the first operational amplifier is connected to a first terminal of the first resistive element directly or via a switch and input to a first input terminal of the AD converter via the first switch, an output of the second operational amplifier is connected to a first terminal of the second resistive element directly or via a switch and input to a second input terminal of the AD converter via the second switch, a second terminal of the first resistive element and a second terminal of the second resistive element are connected so that resistance voltage division is performed, and a common mode voltage level of the extracted output voltage is input to the first input terminal of the AD converter via the third switch, a first terminal of the fourth switch is connected to a fixed voltage, and a second terminal of the fourth switch is input to the second input terminal of the AD converter, in the normal mode, the first, second, and fifth switches are turned on, the AD converter receives the outputs of the first and second operational amplifiers as an input and outputs digital data via the fifth switch, in the adjustment mode, the third, fourth, and sixth switches are turned on, the common mode voltage level of the output voltage is input to the first input terminal of the AD converter, the fixed voltage is input to the second input terminal of the AD converter, and a voltage difference applied to the first and second input terminals of the AD converter is converted into a digital signal, the digital signal is input to the digital control unit via the sixth switch, and the digital control unit controls the common mode voltage level of the output voltage by controlling the capacitance values of the first and second digitally controlled variable capacitors on the basis of the digital signal.

4. The capacitive sensor according to claim 2, wherein the CV conversion circuit is a fully differential CV conversion amplifier, a signal in which the capacitance values of the first detection capacitor and the first digitally controlled variable capacitor are reflected is input to a first input terminal of the fully differential CV conversion amplifier, a signal in which the capacitance values of the second detection capacitor and the second digitally controlled variable capacitor are reflected is input to a second input terminal of the fully differential CV conversion amplifier, the capacitive sensor further comprises a common mode feedback circuit including a common mode detection circuit, the common mode feedback circuit performs control of feeding an average voltage value of first and second outputs of the fully differential CV conversion amplifier back to the fully differential CV conversion amplifier, the capacitive sensor further comprises first and second resistive elements and first, second, third, fourth, fifth, and sixth switches, the first and second resistive elements are a pair of resistive elements having substantially equal resistance values, one of electrodes of the first detection capacitor is connected to a first terminal of the first resistive element directly or via a switch and connected to the first input terminal of the fully differential CV conversion amplifier via the first switch, one of electrodes of the second detection capacitor is connected to a first terminal of the second resistive element directly or via a switch and connected to the second input terminal of the fully differential CV conversion amplifier via the second switch, a first output of the fully differential CV conversion amplifier is input to a first input terminal of the AD converter, a second output of the fully differential CV conversion amplifier is input to a second input terminal of the AD converter, a second terminal of the first resistive element and a second terminal of the second resistive element are connected so that resistance voltage division is performed, and the common mode voltage level of the extracted input voltage is input to the first input terminal of the fully differential CV conversion amplifier via the third switch, a first terminal of the fourth switch is connected to a fixed voltage, a second terminal of the fourth switch is input to a second input terminal of the fully differential CV conversion amplifier, in the normal mode, the first, second, and fifth switches are turned on, a signal corresponding to the capacitance value of the first detection capacitor is input to the first input terminal of the fully differential CV conversion amplifier, a signal corresponding to the capacitance value of the second detection capacitor is input to a second input terminal of the fully differential CV conversion amplifier, and the AD converter receives first and second outputs of the fully differential CV conversion amplifier as an input and outputs digital data via the fifth switch, in the adjustment mode, the third, fourth, and sixth switches are turned on, a common mode voltage level of the input voltage is input to the first input terminal of the fully differential CV conversion amplifier, a fixed voltage is input to the second input terminal of the fully differential CV conversion amplifier, and analog signals which are the first and second outputs of the fully differential CV conversion amplifier are converted into digital signals through the AD converter, the digital signals are input to the digital control unit via the sixth switch, and the digital control unit controls the common mode voltage level of the input voltage by controlling the capacitance values of the first and second digitally controlled variable capacitors on the basis of the digital signals.

5. The capacitive sensor according to claim 2, wherein the first and second feedback capacitors are substantially equal in the capacitance value to each other, first and second electrodes of the first feedback capacitor are connected to a first input and a first output of the CV conversion circuit directly or via a switch, and first and second electrodes of the second feedback capacitor are connected to a second input and a second output of the CV conversion circuit directly or via a switch.

6. The capacitive sensor according to claim 5, further comprising, third and fourth resistive elements, wherein the third resistive element and the fourth resistive element are a pair of resistive element having substantially equal resistance values, first and second terminals of the third resistive element are connected to a first input terminal and a first output terminal of the CV conversion circuit, and first and second terminals of the fourth resistive element are connected to a second input terminal and a second output terminal of the CV conversion circuit.

7. The capacitive sensor according to claim 5, further comprising,
seventh and eighth switches,
wherein first and second terminals of the seventh switch are connected to a first input terminal and a first output terminal of the CV conversion circuit, and
first and second terminals of the eighth switch are connected to a second input terminal and a second output terminal of the CV conversion circuit.

8. The capacitive sensor according to claim 5, wherein a filter is arranged between the CV conversion circuit and the AD converter, and a signal from which a low frequency band is removed is input to the AD converter.

9. The capacitive sensor according to claim 2, wherein a first input terminal of the first digitally controlled variable capacitor and a first input terminal of the second digitally controlled variable capacitor are connected and supplied with a first signal,
a first electrode of the first detection capacitor and a first electrode of the second detection capacitor are connected and supplied with a second signal,
a second electrode of the first detection capacitor and a second terminal of the first digitally controlled variable capacitor are connected and connected to a first input terminal of the CV conversion circuit, and
a second electrode of the second detection capacitor and a second terminal of the second digitally controlled variable capacitor are connected and connected to a second input terminal of the CV conversion circuit.

10. The capacitive sensor according to claim 2, further comprising:
a third detection capacitor connected in series with the first detection capacitor; and
a fourth detection capacitor connected in series with the second detection capacitor,
wherein, in a case in which the physical quantity serving as the measurement target is not substantially zero, capacitance values of the third and fourth detection capacitors are changed from capacitance values in a case in which the physical quantity is substantially zero in accordance with the physical quantity as the measurement target,
change amounts of the capacitance values of the third and fourth detection capacitors are opposite in sign to each other, and absolute values are substantially equal to the change amounts of the capacitance values of the first and second detection capacitors capacitor,
a first input terminal of the first digitally controlled variable capacitor and a first input terminal of the second digitally controlled variable capacitor are connected and supplied with a first signal,
a second signal is supplied to a first electrode of the first detection capacitor and a first electrode of the second detection capacitor,
a third signal is supplied to a first electrode of the third detection capacitor and a first electrode of the fourth detection capacitor,
the second signal and the third signal have the same amplitude but opposite polarities,
a second electrode of the first detection capacitor, a second electrode of the third detection capacitor, and a second terminal of the first digitally controlled variable capacitor are connected and connected to a first input terminal of the CV conversion circuit, and
a second electrode of the second detection capacitor, a second electrode of the fourth detection capacitor, and a second terminal of the second digitally controlled variable capacitor are connected and connected to a second input terminal of the CV conversion circuit.

11. A capacitive sensor, comprising:
a first MEMS capacitive element having a capacitance value changing in accordance with reflection of a change in a physical quantity;
a second MEMS capacitive element having a capacitance value changing in accordance with reflection of the change in the physical quantity;
a first variable capacitor connected with the first MEMS capacitive element;
a second variable capacitor connected with the second MEMS capacitive element;
a CV conversion circuit that includes a first input terminal, a second input terminal, a first output terminal, and a second output terminal, and generates a voltage in which a change in the capacitance value of the first MEMS capacitive element and a change in the capacitance value of the second MEMS capacitive element are reflected;
a detection circuit that detects an average voltage of input voltages of the first input terminal and the second input terminal of the CV conversion circuit or an average voltage of output voltages of the first output terminal and the second output terminal of the CV conversion circuit;
an analog digital converter that converts the average voltage into a digital average voltage signal; and
a control circuit that changes the capacitance values of the first variable capacitor and the second variable capacitor on the basis of the digital average voltage signal,
wherein a connection point of the first MEMS capacitive element and the first variable capacitor is connected to the first input terminal, and
a connection point of the second MEMS capacitive element and the second variable capacitor is connected to the second input terminal.

12. The capacitive sensor according to claim 11, further comprising,
a switch that switches an adjustment mode in which the average voltage serving as an output of the detection circuit is input to the analog digital converter, and the digital average voltage signal is obtained and a normal mode in which outputs of the first output terminal and the second output terminal of the CV conversion circuit in which the change in the physical quantity is reflected are input to the analog digital converter, and digital data is obtained.

13. The capacitive sensor according to claim 12, wherein, in the adjustment mode, the control circuit compares the digital average voltage signal with a reference value and generates a digital control signal for changing the capacitance values of the first variable capacitor and the second variable capacitor on the basis of a comparison result.

14. A capacitive sensor, comprising:
a sensor unit that includes a pair of capacitors configured with a fixed electrode and a movable electrode, applies a voltage to one of the fixed electrode and the movable electrode, extracts charges accumulated in the pair of capacitors from the other electrode, and obtains two output signals;
a CV converting unit that receives the two output signals as an input, reflects the charges extracted from the sensor unit in a capacitance value of a feedback capacitor, converts a voltage signal, and obtains a differential output;

an AD converter that converts the differential output of the CV converting unit into a digital signal; and a variable capacitor having a capacitance value which is controlled on the basis of the digital signal; and a voltage-dividing resistive circuit that extracts a common mode output potential of the differential output, wherein one electrode of the variable capacitor is connected to the other electrode from which the accumulated charges are extracted, and the common mode output potential of the differential output is controlled by controlling a capacitance value of the variable capacitor, an output of the voltage-dividing resistive circuit is input to a first terminal of the AD converter, a fixed potential is input to a second terminal of the AD converter, a difference signal between an input of the first terminal and an input of the second terminal is the digital signal, and the capacitive sensor further comprises a digital control unit that generates a control signal for controlling the capacitance value of the variable capacitor on the basis of a result of comparing the digital signal with a reference signal.

* * * * *